AUTOMATIC FILTER SELECTOR

Filed July 17, 1967 4 Sheets-Sheet 1

LEVEL SENSING OF A PERIODIC SIGNAL

LEVEL SENSING OF A PERIODIC SIGNAL WITH HIGH FREQUENCY NOISE

BAND PASS FILTER FREQUENCY RESPONSE

INVENTOR.
CHARLES L. McMURTRIE
BY
Jefferson Ehrlich
ATTORNEY

LEVEL SENSING OF A PERIODIC SIGNAL WITH LOW FREQUENCY NOISE

AUTOMATIC GAIN CONTROL AMPLIFIER & FILTERS

INVENTOR.
CHARLES L. McMURTRIE
BY Jefferson Ehrlich
ATTORNEY

Aug. 4, 1970 C. L. McMURTRIE 3,522,449

AUTOMATIC FILTER SELECTOR

Filed July 17, 1967 4 Sheets-Sheet 3

INVENTOR.
CHARLES L. McMURTRIE
BY Jefferson Ehrlich
ATTORNEY

INVENTOR.
CHARLES L. McMURTRIE
BY Jefferson Ehrlich
ATTORNEY

United States Patent Office 3,522,449
Patented Aug. 4, 1970

3,522,449
AUTOMATIC FILTER SELECTOR

Charles L. McMurtrie, North Plainfield, N.J., assignor to American Standard Inc., New York, N.Y., a corporation of Delaware Filed July 17, 1967, Ser. No. 653,855
Int. Cl. H03k 5/20
U.S. Cl. 307—235 58 Claims

ABSTRACT OF THE DISCLOSURE

The present invention is directed to a circuit having a series of identical channels each receiving an output signal from an individual filter in a filter network so that the circuit will automatically select the frequency band containing the largest signal voltage and direct the signals within that band to its own output. The circuit is particularly adapted for use in a flow meter.

Each channel contains an emitter follower which receives the output from its respective filter and whose output is in turn divided into two AC signals. One signal is passed through a sensing leg and the other signal goes directly through a diode to the circuit output. The sensing signal is converted into a proportional DC signal and appears at the base of a keying transistor whose emitter is connected along with all those of its counterparts in the other channels to a common resistor forming a voltage comparator.

A regenerative transistor is connected to each keying transistor to conduct in proportion to it and thereby increase its conduction which action causes the keying transistor with the largest signal to increase conduction and though the voltage compaator to back bias all the others to cut off. Each regenerative transistor is connected to a shunting transistor which conducts in inverse proportion to it and which is connected to the direct leg at the diode to circuit output. The shunting transistor in the sensing leg of the dominant signal's channel will be shut off by the conduction of its associated transistors and permit the signal in the direct leg to go to the circuit output while the shunting transistors in the other channels will conduct and dampen the signals in the direct legs. The signals in the band containing the dominant signal are the only ones which will pass to an emitter follower connected to the output terminal of the selector circuit.

BRIEF SUMMARY OF THE INVENTION

The present invention is directed to a circuit for a flow meter which will automatically select the frequency band of largest signal voltage passing through a filter network and direct this band to the exclusion of all others to its own output. More particularly, the circuitry will operate on the output of an electronic device, such as flow meter, whose signal contains large broad band noise and will automatically select the band containing the largest signal voltage from the output of a comb filter or from a series of individual filters and present this band at its own output for analysis.

In measuring frequency or period or in totalizing of periodic electric signals, it is necessary to sense when the input signal passes through one or more predetermined levels. The number of times that the input signal passes through these levels per unit of time is an indication of its frequency. Likewise, the period of the input signal is determined by measuring the elapsed time between two successive passes of the input signal through these predetermined levels. Totalizing is accomplished by counting the number of times the input signal passes through the predetermined levels.

A primary source of error in these measurements is the presence of noise on the input signal. High frequency noise impressed upon the signal will cause it to cross the predetermined levels an excessive amount of times when in the measuring range and will result in extraneous and erroneous counts. Low frequency noise may cause several cycles of the input signal never to reach the predetermined level and likewise introduce an inaccurate count.

Increasing the distance between the predetermined levels will minimize the counting error caused by the high frequency noise but will tend to increase the counting error caused by the low frequency noise. Alternately, decreasing the distance between the predetermined levels will give the undesirable converse result.

If the input signal with its associated noises is passed through a filter network tuned to the input signal frequency, this will greatly attenuate the noise signal and thus remove the source of error. However, this requires the use of a fixed filter and the input signal frequency must be known in advance. If the input signal frequency is unknown then a tuneable filter must be incorporated and will necessitate an adjustment each time the signal frequency changes.

The circuitry of the present invention solves these problems by providing a common filter network and the over-all arrangement will select an input signal on the bases of its magnitude from various frequency bands, block all signals outside of the passband selected, and present the selected signals to a registering or measuring device for accurate analysis.

It is therefore an object of the present invention to provide a circuit for selecting the signal or largest amplitude from a composite signal.

It is another object of the present invention to provide an improved circuit for selecting the frequency band of largest amplitude from a broad band signal.

Another object of the present invention is to provide an improved circuit for removing the high and low frequency noise from an input signal.

A further object of the present invention is to provide an improved circuit which will permit an accurate measurement of the output of a flow meter.

Other and further objects of the invention will be obvious upon an understanding of the illustrative embodiment about to be described, or will be indicated in the appended claims, and various advantages not referred to herein will occur to one skilled in the art upon employment of the invention in practice.

BRIEF DESCRIPTION OF THE DRAWINGS

A preferred embodiment of the invention has been chosen for purposes of illustration and description and is shown in the accompanying drawings, forming a part of the specification, wherein.

DETAILED DESCRIPTION

Figure 1:
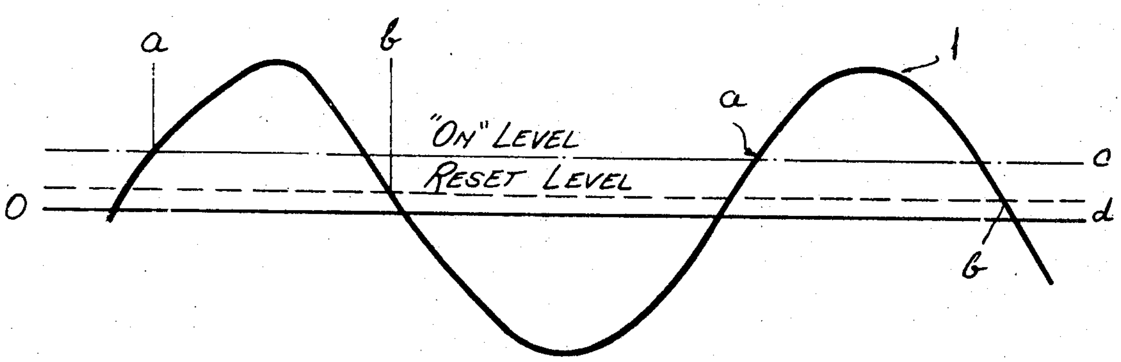
FIG. 1 is a representation of a periodic signal input to a counting device showing the "on" and "reset" levels at which the device is responsive.
Figure 2:
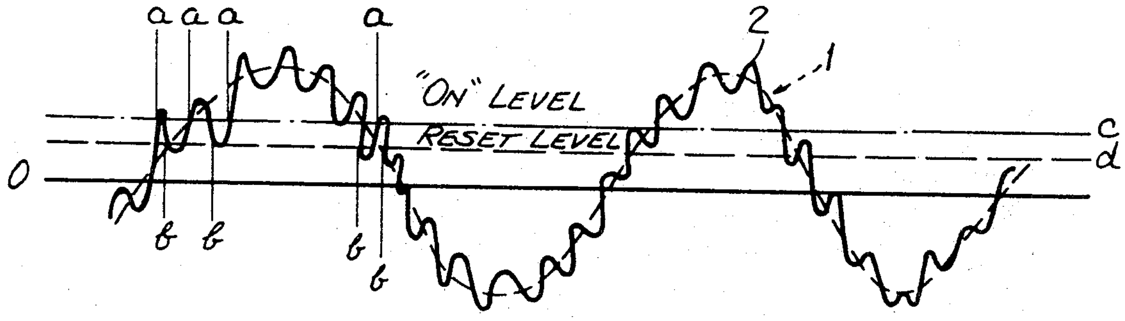
FIG. 2 is a representation of a periodic signal as shown in FIG. 1 with high frequency noise impressed thereon.
Figure 3:
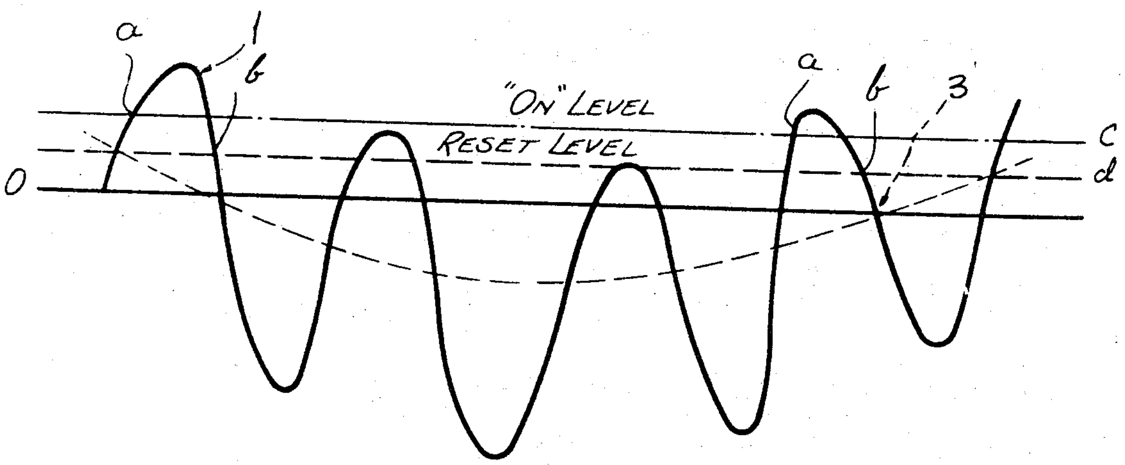
FIG. 3 is a representation of a periodic signal as shown in FIG. 1 with low frequency noise impressed thereon.

In order to explain more fully the problem which the present invention is designed to solve, FIGS. 1, 2 and 3 show representations of the various periodic signals to be measured in a counting device.

FIG. 1 shows a pure periodic signal 1 which is fed to the input of the counter. The counter contains circuitry which will go into an "on" state when the input signal reaches a given level, which level is represented by the line *c* on the drawing. The circuit will continue in the "on" state until the signal level drops to the "reset" level, represented by the line *d*, whereupon the associated circuitry comes out of the "on" state.

The points labeled *a* indicate the points at which the input signal reaches the "on" level and points labeled *b* indicate the points where the input signal drops to the "reset" level. If a signal or count is generated each time the "on" state occurs (points labeled *a*) then the frequency or period or total number of cycles of the input signal can readily be measured.

However, the input signal, particularly when coming from a flow meter, such as the Swirlmeter shown and described in the U.S. Pat. 3,279,251 assigned to the same assignee, will frequently have noise imposed upon it whose amplitude is of lower magnitude than the primary signal and this is a source of error in counting measurements. FIGS. 2 and 3 illustrate how these errors are produced by high and low frequency "noises" respectively.

In FIG. 2 it will be seen how the high frequency noise 2 present on the periodic signal 1 will cause the amplitude of the periodic signal to vary within certain local limits. When the magnitude of these limits is of the order of the difference between the registering levels *c* and *d*, this local variation will cause the input signal to pass through the "on" and "reset" levels in rapid succession. In this case the counter will be keyed to the "on" state (points labeled *a*) a number of times for each cycle of the input signal thereby producing an extraneous number of counts which give a false indication of the actual level of the underlying period signal 1.

FIG. 3 shows what happens when low frequency noise 3 is impressed on the periodic input signal 1; its level may be depressed sufficiently so that several cycles of the input signal never reach the "on" level *c* to trigger the counter and an erroneous measurement will again result.

It is readily apparent upon considering these illustrations that widening the separation between the "on" level *c* and the "reset" level *d* in FIG. 2 by an amount that exceeds the peak amplitude of the high frequency noise 2 would prevent extraneous counts. However, as seen by reference to FIG. 3, this will tend to increase the error caused by low frequency noise because more of the cycles of the input signal will not reach the "on" level. Conversely, to avoid missing cycles, as shown in FIG. 3, the "on" level *c* and "reset" level *d* could be moved closer together and nearer to the zero axis of the input signal. However this will tend to increase the counting error when high frequency noise is present.

The present invention will take an input signal and its associated noise, pass it through a comb filter or several band pass filters, select the band with the largest voltage signal output and direct the signal of the band chosen to an output for measurements. The number of pass bands required in the comb filter or band pass filters is a function of the signal to noise ratio and the frequency range to be measured. More filter bands will be required to cover a wide frequency range than a narrower range with a given signal to noise ratio. Conversely the filter bands may be made much wider with a lower signal-to-noise ratio. The signal-to-noise ratio must be greater than unity in order that the circuit arrangement may operate properly.

Figure 4:
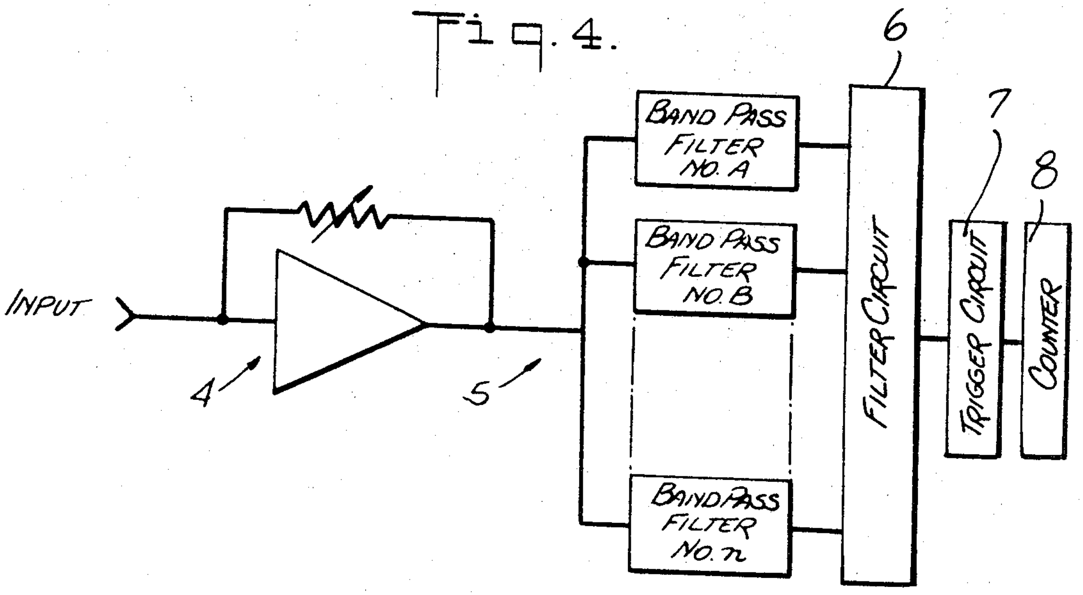
FIG. 4 is a schematic or block diagram of an automatic gain control amplifier and filter network which may be used to separate the periodic signal and the impressed noise into component frequency bands.

As shown in FIG. 4, the circuit of the present invention first includes an automatic gain control (A.G.C.) amplifier 4 to adjust the signal levels of the flow meter or other signal producer output to be compatible with the sensing levels of the filter selector circuit. This eliminates the necessity for readjusting the levels should be output signal amplitude change.

The output from a flow meter such as the Swirlmeter above noted, or similar device, is fed to the automatic gain control amplifier 4 whose output signal will remain relatively constant for large changes in the input signal. As previously stated, the level of this output is chosen to be compatible with the sensing levels of the filter selector circuit. The amplifier output signal is fed into a series of individual band pass filters 5 or alternatively to a comb filter (not shown). The insertion loss of the filter bands should be approximately equal.

Figure 5:
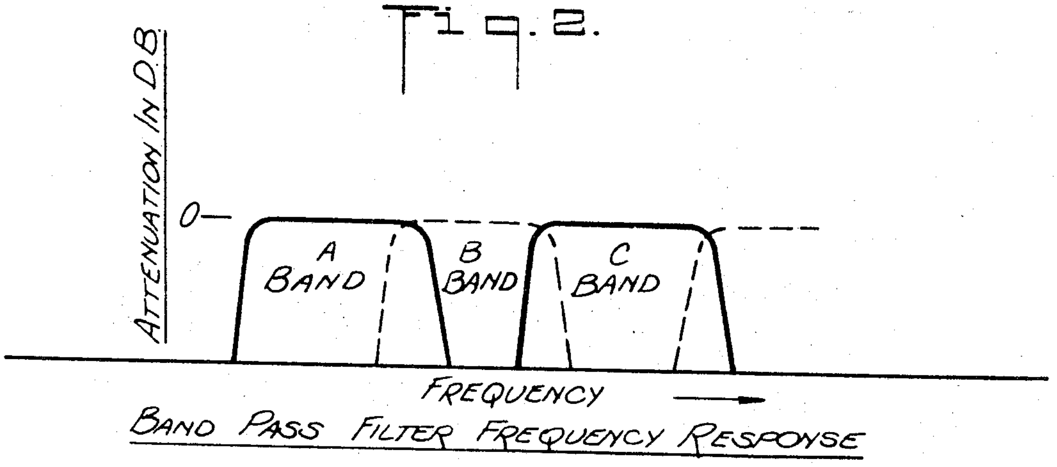
FIG. 5 is a representation of the band pass filter frequency response of the filter network shown in FIG. 4.

The frequency response of the pass bands of the filters are overlapped slightly to provide an hysteresis effect of prevent the circuit from toggling back and forth. This overlapping frequency response of the pass bands of the filters is represented in FIG. 5. As shown, three filter bands A, B and C are chosen as sufficient for purposes of illustration but it will be understood that any number may be used, as may be necessary.

Figure 6:
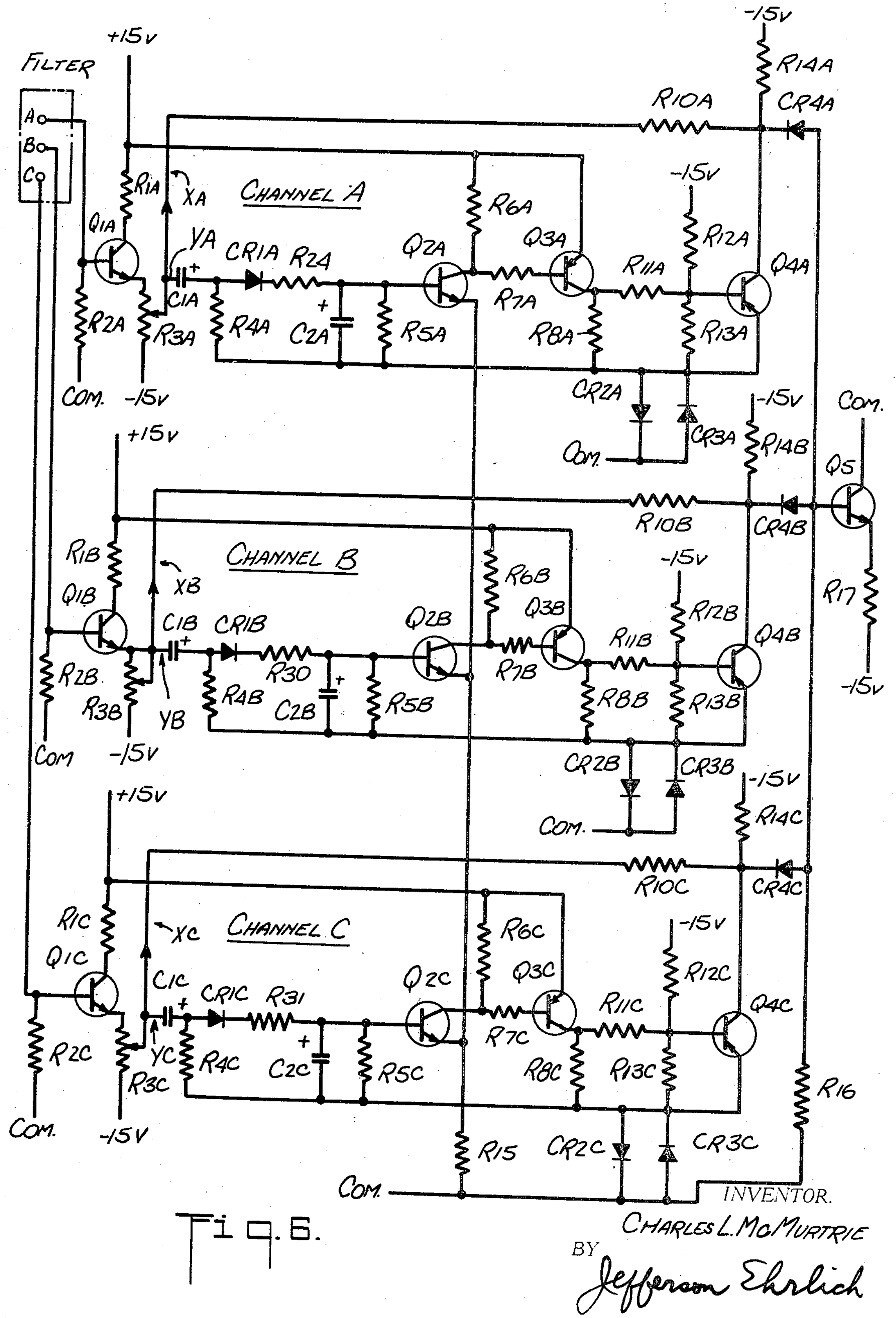
FIG. 6 is a schematic diagram of a preferred embodiment of the circuit of the present invention.

The output signals from each band pass filter A, B and C are fed into the filter selector circuit 6 shown in FIG. 6. The circuit has three channels A, B and C for receiving the outputs from filters A, B and C. Here again, any number of channels may be used as required depending on the frequency range and signal to noise ratio, as previously explained.

The channels A, B and C have identical components so that, for ease in description, corresponding components are given identical numbers with suffixes added to indicate the channel. For example, the sixth resistor in channel A is designated R6A and corresponding resistors in channels B and C are designated R6B and R6C, respectively.

The operation of the circuit 6 will be explained with respect to channel B it being understood that channels A and C operate in identical manner.

Assume that the AC signal from the B band of the filter 5 is larger than the signals from bands A and C and that the magnitude of the B band signal is such that it exceeds a minimum threshold value which will initiate circuit operation. The outputs from the filter band B are fed into emitter follower Q1B for impedance matching and power gain. Two outputs, X and Y, are taken from emitter follower Q1B. The Y signal is passed through sensinug leg YB and the X signal passes through parallel leg XB to a diode CR4B connected to the base of output emitter follower Q5, which is common to all channels.

The Y signal passing to the sensing leg YB of channel B is AC and is coupled through capacitor C1B, rectified CR1B and filtered by capacitor C2B and resistance R5B to produce a positive DC signal (proportional to the AC input) at the base of a transistor Q2B, (NPN) which will be hereinafter referred to as a *keying* transistor. When the magnitude of the DC signal at the base of keying transistor Q2B (which signal also includes the voltage drop across either diode CR2B or diode CR3B, whichever is conducting) exceeds a minimum threshold value, the keying transistor Q2B will start conducting which causes the collector voltage thereof to drop.

The collector of keying transistor Q2B is connected to the base of a regenative transistor Q3B (PNP) so that it starts to conduct when the collector voltage of keying transistor Q2B starts to drop. This, in turn, causes the voltage across diodes CR2B and CR3B to become more positive so as to increase the DC voltage on the base of keying transistor Q2B. Thus, a regenerative action occurs.

The conduction of Q2B will continut to increase until steady state conditions are reached when regenerative transistor Q3B is saturated. Saturation of regenerative transistor Q3B causes a shunting transistor Q4B (PNP), whose base is connected to the collector of Q3B through resistance R11B to shut off and the voltage across diodes CR2B and CR3B is now positive because of the forward drop across these diodes.

The X signal passing through the direct leg XB is divided down by the resistive network consisting of R10B, R14B and R16 and is passed through the conducting diode CR4B to the base of output emitter follower Q5.

It will be seen that during the regenerative operation of regenerative transistor Q3B in channel B, the positive voltage from the drop across diodes CR2B and CR3B causes the emitter voltage of the keying transistor to be raised by that amount and to increase conduction accordingly. The emitter of the keying transistor Q2B is connected along with the keying transistors Q2A and K2C in channels A and C to a common emitter resistor R15 forming a voltage comparable.

The increased conduction of keying transistor Q2B in channel B increases the voltage drop across R15 to cause the voltages at the emitters of keying transistors Q2A and Q2C in channels A and C to become more positive thereby back biasing the keying transistors Q2A and Q2C to the point of cut off. When the keying transistors Q2A and Q2C are cut off, the associated regenerative transistors Q3A and Q3C in channels A and C are also turned off, which in turn, cause the shunting transistors Q4A and Q4B to conduct to saturation. The X signals in chanels A and C passing along the direct legs of XA and XC will then be shunted through shunting transistors Q4A and Q4C and diodes CR3A and CR3C, respectively, to ground. Since diodes CR4A and CR4C are back biased, any shunting of the B channel signal by the A and C channels is prevented.

The filter selector circuit output then appearing at the output emitter follower Q5 will consist only of the output signals from channel B which is the signal having greatest magnitude.

Figure 7:
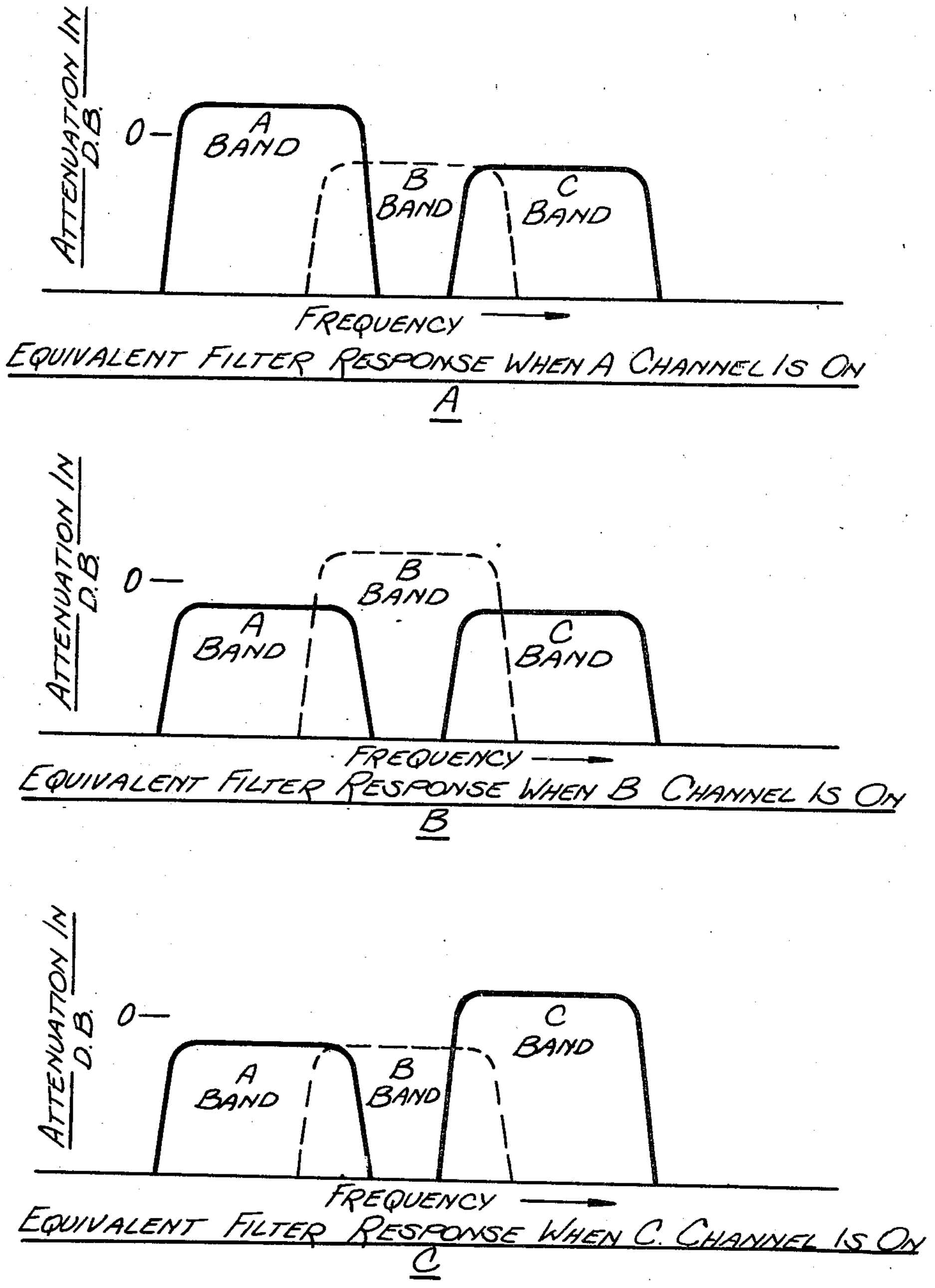
FIG. 7 is a representation of the equivalent filter responses of three of the channels of the improved circuit of the present invention when each is in the "on" condition.

If the DC voltage developed across the diodes CR2 and CR3 in each of the channels of the selector circuit were converted to an equivalent AC signal at the output of equivalent filters, it would produce an effect as shown in FIG. 7. When the frequency response of the three filter bands shown in FIG. 7 is compared to the response shown in FIG. 5 it can be seen that the two non-conducting channel equivalent signals are attenuated while the conducting channel signal is increased. This provides an hysteresis effect in the circuit which will hold a particular band switched in until this equivalent signal drops to or below the equivalent signal of another channel. This, together with the overlap in filter bands, prevents the circuit from toggling from one band to the other when the input signal is close to the end of a band.

It will thus be seen that a circuit has been provided which will take the broad band output from a flow meter such as the Swirlmeter or similar device, separate it into its component signals and select the component signal of greatest signal voltage which will then be fed to its output for accurate counting or measurement.

It will be apparent the circuit shown and described in FIG. 6 may be connected through an automatic gain control amplifier to the sensor of a Swirlmeter, sometimes known as a flowmeter, such as is shown and described in the above-mentioned Pat. No. 3,279,251. The arrangement of this invention will provide a signal whose frequency is readily measurable to determine the flow rate. Hence, a standard trigger circuit 7 and standard counter 8, such as that shown in FIG. 4, will indicate the flow rate.

As various changes may be made in the form, construction and arrangement of the parts herein without departing from the spirit and scope of the invention and without sacrificing any of its advantages, it is to be understood that all matter herein is to be interpreted as illustrative and not in a limiting sense.

Having thus described my invention, I claim:

1. A filtering and selecting circuit comprising a plurality of adjacent channels each transmitting a band of frequencies in the sub-radio range, each of said channels having input means and output means, the band widths of the respective adjacent channels slightly overlapping each other, said channels including means for causing an AC signal of greatest magnitude at any instant of time in any of said channels to pass to the output means of a channel and for preventing signals of lesser magnitude from passing to the output means of the other channels.

2. A filtering and selecting circuit as claimed in claim 1 wherein filter means are provided to supply signals of different magnitudes to the input means of said channels.

3. A filtering and selecting circuit as claimed in claim 2 wherein each of said channels is provided with keying means.

4. A filtering and selecting circuit as claimed in claim 3 wherein each of said channels is provided with regenerative means.

5. A filtering and selecting circuit as claimed in claim 4 wherein each of said channels is provided with shunting means.

6. A filtering and selecting circuit as claimed in claim 5 wherein resistor means is connected to all of said keying means.

7. A filtering and selecting circuit as claimed in claim 6 wherein each channel contains first and second conducting means in parallel with each other, said first conducting means adapted to conduct the signal from the input means to the output means and said second conducting means adapted to sense said signal.

8. A filtering and selecting circuit as claimed in claim 7 wherein said second conducting means includes rectifying means.

9. A filtering and selecting circuit as claimed in claim 8 wherein said keying means includes a transistor having a base, an emitter and a collector with the base receiving the output of said rectifying means.

10. A filtering and selecting circuit as claimed in claim 9 wherein said transistor has its emitter connected to said resistor means and its collector connected to said regenerative means.

11. A filtering and selecting circuit as claimed in claim 10 wherein said regenerative means includes diode means connected to said keying means.

12. A filtering and selecting circuit as claimed in claim 11 wherein said regenerative means includes a transistor having a base, an emitter and a collector with said base connected to said keying means and said collector connected to said shunting means.

13. A filtering and selecting circuit as claimed in claim 12 wherein said shunting means includes a transistor having a base, an emitter and a collector with said base and said emitter connected to said regenerative means and said collector connected to the output means.

14. A filtering and selecting circuit as claimed in claim 13 wherein said first conducting means contains a resistor means in parallel with said second conducting means.

15. A filtering and selecting circuit as claimed in claim 14 wherein a plurality of diodes are connected between the output means and the outputs of said channels.

16. A filtering and selecting circuit as claimed in claim 15, wherein each channel is provided with amplifying means for receiving said signal and passing it to said first and second conducting means.

17. A filtering and selecting circuit as claimed in claim 16, wherein diode means are connected to the emitter of the shunting transistor and resistively to the base thereof.

18. A filtering and selecting circuit comprising a plurality of adjacent channels each transmitting a band of frequencies in the sub-radio range, the band widths the respective adjacent channels slightly overlapping each other, keying means, regenerative means and shunting means in each of said channels, and a resistor means connected in common to all the keying means, whereby the channels receiving an AC signal of greatest magnitude will pass instantly all signals in that channel to the circuit output and all the other channels will shunt other signals to ground.

19. A filtering and selecting circuit as claimed in claim 18, wherein each channel contains first conducting means for conducting the signal to the channel output terminal and second conducting means to sense said signal, said second conducting means being connected in parallel to said first conducting means.

20. A filtering and selecting circuit as claimed in claim 19, wherein said second conducting means includes rectifying means.

21. A filtering an dselecting circuit as claimed in claim 20, wherein said keying means includes a transistor having a base, an emitter and a collector, the base of said transistor adapted to receive the output of said rectifying means.

22. A filtering and selecting circuit as claimed in claim 21, wherein said transistor has its emitter connected to said resistor means and its collector connected to said regenerative means.

23. A filtering and selecting circuit as claimed in claim 22, wherein said regenerative means includes diode means connected to keying means.

24. A filtering and selecting circuit as claimed in claim 23, wherein said regenerative means includes a transistor having a base, an emitter and a collector with said base connected to said keying means and said collector connected to said shunting means.

25. A filtering and selecting circuit as claimed in claim 24, wherein said shunting means includes a transistor having a base, an emitter and a collector with said base and said emitter connected to said regenerative means and said collector connected to the channel output terminal.

26. A filtering and selecting circuit as claimed in claim 25, wherein filter means are provided to supply signals to said channels.

27. A filtering and selecting circuit comprising a plurality of channels each transmitting a band of frequencies, each of said channels including amplifying means; sensing means comprising rectifying means, keying means, regenerative means and shunting means; a resistor in parallel with said sensing means; a plurality of diodes connected to the output terminals of said channels, said diodes connected in common to the output terminal of said circuit; and voltage comparator means including resistor means connected in common to all of said keying means, whereby the keying means in the channel receiving the filter output of greatest magnitude increases conduction while the keying means in the other channels decrease conduction to cut off through the voltage comparator means, thereby causing the regenerative means in the cut off channels to cease conduction and also resulting in conduction of their associated shunting means such that the output of each of the cut off channels is passed to ground while the output in the conducting channel reciving the filter output of greatest magnitude passes to the output terminal of said circuit.

28. A filtering and selecting circuit comprising a plurality of AC channels each receiving one of the frequency band components of an AC signal and containing a first, second, third and fourth transistor means all having an emitter, a base and a collector, each of said channels comprising amplifying means including said first transistor receiving said AC signal frequency component and passing it to two circuit legs connected in parallel, one of said legs resistively connected to the output terminal of the channel, the other of said legs comprising rectifying means converting said AC signal to a positive DC signal proportional thereto, keying means including said second transistor having its base receiving said DC signal, regenerative means including said third transistor having its base resistively connected to the collector of said second transistor and diode means connected to the base of said second transistor and the collector of said third transistor, shunting means including said fourth transistor having its base resistively connected to the collector of said third transistor and diode means connected to the emitter and resistively to the base of said fourth transistor; a plurality of diodes connected to the output terminal of said circuit and each connected to a respective output terminal of one of said channels; and voltage comparator means including resistor means connected in common to the emitters of the second transistors whereby said second transistor in the channel receiving the frequency band component of greatest magnitude will be caused to increase in conduction passing said signal to the output terminal of said circuit while said second transistors of the other channels will be back biased to cut off through the voltage comparator means thereby causing said associated third transistors to cut off and resulting in conduction of said associated fourth transistors such that the signal in the direct leg of each cut off channel is passed to ground.

29. A filtering and selecting circuit comprising a plurality of alternating current transmission channels, each channel including an emitter follower; a first diode means resistively connected to the output of said emitter follower; a capacitive means connected to the output of said emitter follower; a second diode means connected to said capacitive means; a filter means resistively connected to said second diode means; a first transistor having a base, an emitter, and a collector; said base connected to said filter means; a second transistor having a base, and emitter, and a collector; the base of said second transistor being resistively connected to the collector of said first transistor; third diode means connected to said filter and to the collector of said second transistor means; a third transistor having a base, an emitter, and a collector; the base of said third transistor being connected to the collector of said second transistor and to said third diode means; the emitter of said third transistor being connected to said third diode means and the collector being connected to said first diode means; and a resistor means connected in common to the emitters of said first transistors in each channel and the first diode in each channel connected in common to the circuit output terminal whereby the first transistor in the channel having the input signal of greatest magnitude will be caused to increase in conduction passing said signal to the output terminal of said circuit, while the first transistors of the other channels will be back biased to cut off through said resistor means thereby causing said associated second transistors to cut off and resulting in conduction of said associated third transistors such that the output signals from said emitter followers passing to said first diodes are shunted to ground.

30. In combination with a flow detection device, a filtering and selecting circuit for the flow detection device comprising a plurality of adjacent channels each transmitting a slightly different range of frequencies generated by the flow detection device, each of said channels having individual input means and individual output means, said channels each including means for causing an AC signal of greatest magnitude among all of the signals in the ranges of frequencies to pass instantly to the output means of a channel and means for simultaneously preventing signals of lesser magnitude in the other channels from passing to the output means of the other channels.

31. The combination as claimed in claim 30, wherein filter means are provided to supply signals of different magnitudes to the input means of said channels.

32. The combination as claimed in claim 31, wherein each of said channels is provided with keying means.

33. The combination as claimed in claim 32 wherein each of said channels is provided with regenerative means.

34. The combination as claimed in claim 33 wherein each of said channels is provided with shunting means.

35. The combination as claimed in claim 34 wherein resistor means is connected to all of said keying means.

36. The combination as claimed in claim 35 wherein each channel contains first and second conducting means in parallel with each other, said first conducting means adapted to conduct the signal from the input means to the output means and said second conducting means adapted to sense said signal.

37. The combination as claimed in claim 36 wherein said second conducting means includes rectifying means.

38. The combination as claimed in claim 37 wherein said keying means includes a transistor having a base, an emitter and a collector with the base receiving the output of said rectifying means.

39. The combination as claimed in claim 38, wherein said transistor has its emitter connected to said resistor means and its collector connected to said regenerative means.

40. The combination as claimed in claim 39 wherein said regenerative means includes diode means connected to said keying means.

41. The combination as claimed in claim 40, wherein said regenerative means includes a transistor having a base, an emitter and a collector with said base connected to said keying means and said collector connected to said shunting means.

42. The combination as claimed in claim 41, wherein said shunting means includes a transistor having a base, an emitter and a collector with said base and said emitter connected to said regenerative means and said collector connected to the output means.

43. The combination as claimed in claim 42, wherein said first conducting means contains a resistor means in parallel with said second conducting means.

44. The combination as claimed in claim 43, wherein a plurality of diodes are connected between the output means and the outputs of said channels.

45. The combination as claimed in claim 44, wherein each channel is provided with amplifying means for receiving said signal and passing it to said first and second conducting means.

46. The combination as claimed in claim 45, wherein diode means are connected to the emitter of the shunting transistor and resistively to the base thereof.

47. In combination with a fluid detection device, a filtering and selecting circuit for sensing the fluid flow characteristics, comprising a plurality of channels each transmitting alternating currents generated by the operation of said flood detection device, keying means, regenerative means and shunting means in each of said channels and a resistor means connected in common to all the keying means whereby the channel receiving an alternating current signal of greatest magnitude will instantly pass that input to the circuit output and all the other channels will simultaneously shunt other signals to ground.

48. The combination as claimed in claim 47, wherein each channel contains first conducting means for conducting the signal to the channel output terminal and second conducting means to sense said signal, said second conducting means being connected in parallel to said first conducting means.

49. The combination as claimed in claim 48, wherein second conducting means includes rectifying means.

50. The combination as claimed in claim 49, wherein said keying means includes a transistor having a base, an emitter and a collector, the base of said collector adapted to receive the output of said rectifying means.

51. The combination as claimed in claim 50, wherein said transistor has its emitter connected to said resistor means and its collector connected to said regenerative means.

52. The combination as claimed in claim 51, wherein said regenerative means includes diode means connected to said keying means.

53. The combination as claimed in claim 52, wherein said regenerative means includes a transistor having a base, an emitter and a collector with said base connected to said keying means and said collector connected to said shunting means.

54. The combination as claimed in claim 53, wherein said shunting means includes a transistor having a base, an emitter and a collector with said base and said emitter connected to said regenerative means and said collector connected to the channel output terminal.

55. The combination as claimed in claim 54, wherein filter means are provided to supply signals to said channels.

56. In combination with a flow meter, a filtering and selecting circuit for the meter, comprising a plurality of AC channels each of said channels including amplifying means; sensing means comprising rectifying means, keying means, regenerative means and shunting means; a resistor in parallel with said sensing means; a plurality of diodes connected to the output terminals of said channels, said diodes connected in common to the output terminal of said circuit; and voltage comparator means including resistor means connected in common to all of said keying means whereby the keying means in the channel receiving the filter output of greatest magnitude increases conduction while the keying means in the other channels decrease conduction to cut off through the voltage comparator means thereby causing the regenerative means in the cut off channels to cease conduction and resulting in conduction of their associated shunting means such that the output of each of the cut off channels is passed to ground while the output in the conducting channel passes to the output terminal of said circuit.

57. In combination with a flow meter, a filtering and selecting circuit for the meter, comprising a plurality of AC channels each receiving one of the frequency band components of an AC signal and containing a first, second, third and fourth transistor means all having an emitter, a base and a collector, each of said channels comprising amplifying means including said first transistor receiving said AC signal frequency component and passing it to two circuit legs connected in parallel, one of said legs resistively connected to the output terminal of the channel, the other of said legs comprising rectifying means converting said AC signal to a positive DC signal proportional thereto, keying means including said second transistor having its base receiving said DC signal, regenerative means including said third transistor having its base resistively connected to the collector of said second transistor and diode means connected to the base of said second transistor and the collector of said third transistor, shunting means including said fourth transistor having its base resistively connected to the collector of said third transistor and diode means connected to the emitter and resistively to the base of said fourth transistor; a plurality of diodes connected to the output erminal of said circuit and each connected to a respective output terminal of one of said channels; and voltage comparator means including resistor means connected in common to the emitters of the second transistors whereby said second transistor in the channel receiving the frequency band component of greatest magnitude will be caused to increase in conduction passing said signal to the output terminal of said circuit while said second transistors of the other channels will be back biased to cut off through the voltage comparator means thereby causing said asociated third transistors to cut off and resulting in conduction of said associated fourth transistors such that the signal in the direct leg of each cut off channel is passed to ground.

58. In combination with a flow meter, a filtering and selecting circuit for the meter, comprising a plurality of AC channels, each channel including an emitter follower, a first diode means resistively connected to the output of said emitter follower, a capacitive means connected to the output of said emitter follower, a second diode means connected to said capacitive means, a filter means resistively connected to said second diode means, a first transistor having a base, an emitter, and a collector, said base connected to said filter means, a second transistor having a base, an emitter, and a collector, the base of said second transistor being resistively connected to the collector of said first transistor third diode means connected to said filter and to the collector of said second transistor means, a third transistor having a base, emitter, and collector, the base of said third transistor being connected to the collector of said second transistor and to said third diode means, the emitter of said third transistor being connected to said third diode means and the collector being connected to said first diode means, and a resistor means connected in common to the emitters of said first transistors in each channel and the first diodes in each channel connected in common to the circuit output terminal whereby the first transistor in the channel having the input signal of greatest magnitude will be caused to increase in conduction passing said signal to the output terminal of said circuit, while the first transistors of other channels will be back biased to cut off through said resistor means thereby causing said associated second transistors to cut off and resulting in conduction of said associated third transistors such that the output signals from said emitter followers passing to said first diodes are shunted to ground.

References Cited

UNITED STATES PATENTS

| | | | |
|---|---|---|---|
| 2,503,958 | 4/1950 | Lyons | 328—154 X |
| 2,579,852 | 12/1951 | Olson | 328—154 X |
| 2,904,677 | 9/1959 | Heidester | 328—154 X |
| 2,987,629 | 6/1961 | German | 307—235 |
| 3,041,469 | 6/1962 | Ross | 307—235 |
| 3,092,732 | 6/1963 | Milford | 307—235 |
| 3,166,679 | 1/1965 | Paufve | 307—235 |
| 3,181,008 | 4/1965 | Huckins | 307—235 |
| 3,292,150 | 12/1966 | Wood | 307—242 |

JOHN S. HEYMAN, Primary Examiner

U.S. Cl. X.R.

307—243; 328—154